United States Patent
Roeder et al.

[11] Patent Number: 5,998,236
[45] Date of Patent: Dec. 7, 1999

[54] PROCESS FOR CONTROLLED ORIENTATION OF FERROELECTRIC LAYERS

[75] Inventors: Jeffrey Roeder, Brookfield; Peter C. Van Buskirk, Newtown, both of Conn.

[73] Assignee: Advanced Technology Materials, Inc., Danbury, Conn.

[21] Appl. No.: 09/024,246

[22] Filed: Feb. 17, 1998

Related U.S. Application Data

[62] Division of application No. 08/758,600, Nov. 27, 1996, Pat. No. 5,719,417.

[51] Int. Cl.[6] .................................................. H01L 21/20
[52] U.S. Cl. ........................... 438/104; 438/3; 438/240; 438/761
[58] Field of Search ............................... 438/104, 3, 240, 438/492, 493, 503, 507, 761, 763; 427/248.1

[56] References Cited

U.S. PATENT DOCUMENTS

| | | |
|---|---|---|
| 476,274 | 6/1892 | Huck . |
| 2,490,547 | 12/1949 | Schraner et al. ........................ 219/39 |
| 2,622,184 | 12/1952 | Johneas ..................................... 219/38 |
| 2,801,322 | 7/1957 | Wetherill .................................. 219/39 |
| 2,925,329 | 2/1960 | Yost ........................................... 23/281 |
| 3,190,262 | 6/1965 | Bakish et al. ............................ 118/48 |
| 3,404,873 | 10/1968 | Orens ....................................... 261/141 |
| 3,520,416 | 7/1970 | Keedwell ................................ 210/490 |
| 3,549,412 | 12/1970 | Frey, Jr. et al. ........................ 117/100 |
| 3,659,402 | 5/1972 | Alliger ...................................... 55/233 |
| 3,823,926 | 7/1974 | Bracich ................................... 261/106 |
| 3,969,449 | 7/1976 | Shires et al. ........................... 261/153 |
| 4,036,915 | 7/1977 | Lucero et al. ......................... 261/104 |
| 4,080,926 | 3/1978 | Platakis et al. ............................ 118/5 |
| 4,288,396 | 9/1981 | Ottestad ................................. 261/128 |
| 4,529,427 | 7/1985 | French ..................................... 65/3.12 |
| 4,833,976 | 5/1989 | Loland ..................................... 92/86.5 |
| 4,842,893 | 6/1989 | Yializis et al. ............................ 427/44 |
| 4,847,469 | 7/1989 | Hofmann et al. ...................... 219/273 |
| 4,954,371 | 9/1990 | Zializis ..................................... 427/44 |

(List continued on next page.)

FOREIGN PATENT DOCUMENTS

| | | |
|---|---|---|
| 0 058 571 | 8/1982 | European Pat. Off. . |
| 0 328 333 | 8/1989 | European Pat. Off. . |
| 0 405 634 A2 | 1/1991 | European Pat. Off. . |
| 370473 | 3/1923 | Germany . |
| 58-125633 | 7/1983 | Japan . |
| WO93/04072 | 3/1993 | WIPO . |

OTHER PUBLICATIONS

"Integrated Systems Approach Based on DLI," Bulletin LPDS–Dec. 1994, copyright 1994, MKS Instruments, Inc.

"Direct Liquid Injection Sub–System—DLI–25B," Bulletin DLI–Dec. 1994, MKS Instruments, Inc.

Singh, R.K., et al., "In situ processing of eptiaxial Y–Ba–Cu–O high Tc superconducting films on (100) $SrTiO_3$ and (100) $YS–ZrO_2$ substrates at 500–650° C.," App. Phys. Lett. 54(22), May 29, 1989, pp. 2271–2273.

(List continued on next page.)

*Primary Examiner*—Chandra Chaudhari
*Assistant Examiner*—Keith Christianson
*Attorney, Agent, or Firm*—Steven J. Hultquist; Oliver A.M. Zitzmann

[57] ABSTRACT

There is disclosed a structure of and a method for fabricating a ferroelectric film on a non-conductive substrate. An adhesion layer, e.g., a layer of silicon dioxide and a layer of zirconium oxide, is deposited over a substrate. A conductive layer, e.g., a noble metal, a non-noble metal, or a conductive oxide, is deposited over the adhesion layer. A seed layer, e.g., a compound containing lead, lanthanum, titanium, and oxygen, with a controlled crystal lattice orientation, is deposited on the conductive layer. This seed layer has ferroelectric properties. Over the seed layer, another ferroelectric material, e.g., lead zirconium titanate, can be deposited with a tetragonal or rhombohedral crystalline lattice structure with predetermined and controlled crystal orientation.

12 Claims, 6 Drawing Sheets

U.S. PATENT DOCUMENTS

| | | |
|---|---|---|
| 5,034,372 | 7/1991 | Matsuno et al. ............................ 505/1 |
| 5,097,800 | 3/1992 | Shaw et al. ............................. 118/730 |
| 5,110,622 | 5/1992 | Hasegawa et al. ................... 427/126.1 |
| 5,120,703 | 6/1992 | Snyder et al. ............................. 505/1 |
| 5,139,999 | 8/1992 | Gordon et al. ............................ 505/1 |
| 5,165,960 | 11/1992 | Platts ...................................... 427/166 |
| 5,204,314 | 4/1993 | Kirlin et al. . |
| 5,225,561 | 7/1993 | Kirlin et al. ............................ 546/256 |
| 5,248,787 | 9/1993 | Timmer et al. ......................... 549/206 |
| 5,259,995 | 11/1993 | Matalis ................................... 261/107 |
| 5,280,012 | 1/1994 | Kirlin et al. ............................... 505/1 |
| 5,376,409 | 12/1994 | Kaloyeros et al. .................. 427/248.1 |
| 5,536,323 | 7/1996 | Kirlin et al. . |
| 5,554,866 | 9/1996 | Nishioka et al. . |

OTHER PUBLICATIONS

Yoshitake, T., et al., "As–grown superconducting Bi–Sr–Ca–Cu–O thin films by coevaporation," App. Phys. Lett. 55(7), Aug. 14, 1989, pp. 702–704.

Erbil, A., et al., "A Review of Metalorganic Chemical Vapor Deposition of High–Temperature Superconducting Thin Films," SPIE vol. 1187 Processing of Films for High Tc Superconducting Electronics (1989), 104–109.

Kirlin, Peter S., et al., "Growth of high Tc YBaCuO thin films by metalorganic chemical vapor deposition," SPIE vol. 1187 Processing of Films for High Tc Superconducting Electronics (1989), 115–127.

Zama, H., et al., "Properties of Metalorganic Precursors for Chemical Vapor Deposition of Oxide Superconductors," Japanese Journal of Applied Physics, 29(7), Jul. 1990, pp. L1072–L1074.

Gardiner, R., et al., "Volatile Barium β–Diketonate Polyether Adducts. Synthesis, Characterization, and Metallorganic Chemical Vapor Deposition," Chem. Mater., 3(6), 1991, pp. 1053–1059.

Lackey, W.J., et al., "Rapid chemical vapor deposition of superconducting $YBa_3Cu_3O_x$," Appl. Phys. Lett. 56(12), Mar. 19, 1990, pp. 1175–1177.

Turnipseed, S.B., et al., "Synthesis and Characterization of Alkaline–Earth–Metal β–Diketonate Complexes Used as Precursors for Chemical Vapor Deposition of Thin–Film Superconductors," Inorg. Chem. 1991, 30(6), 1164–1170.

Hiskes, R., et al., "Single source metalorganic chemical vapor deposition of low microwave surface resistance $YBa_2Cu_3O_7$," Appl. Phys. Lett. 59(5), Jul. 29, 1991, pp. 606–607.

Zhang, J., et al., "Plasma Enhanced Metalorganic Chemical Vapor Deposition of Conductive Oxide Electrodes for Ferroelectric $BaTiO_3$ Capacitors," Mat. Res. Soc. Symp. Proc., vol. 310, 1993, pp. 249–254.

Van Buskirk, P., et al., "MOCVD Growth of $BaTiO_3$ in an 8" Single–Wafer CVD Reactor," Proceedings of ISAF92, in press (1992), 3 pages.

Zhang, J., et al., "Single liquid source plasma–enhanced metalorganic chemical vapor deposition of high–quality $YBa_2Cu_3O_{7-x}$ thin films," Appl. Phys. Lett. 61(24), Dec. 14, 1992, pp. 2884–2886.

Panson, A.J., et al., "Chemical vapor deposition of $YBa_2Cu_3O_7$ using metalorganic chelate precursors," Appl. Phys. Lett. 53(18), Oct. 31, 1988, pp. 1756–1757.

Scarsbrook, G., et al., "Low temperature pulsed plasma deposition. Part I–a new technique for thin film deposition with complete gas dissociation," Vacuum, 38(8–10), 1988, pp. 627–631.

TETRAGONAL PEROVSKITE

RHOMBOHEDRAL PEROVSKITE

| Pb (at%) | La (at%) | Ti (at%) | (Pb+La)/Ti | ORIENTATION | p (nC/cm²) | ε |
|---|---|---|---|---|---|---|
| 43.33 | 7.37 | 49.30 | 1.03 | [100] | 1.8 | 537 |
| 42.69 | 7.14 | 50.17 | 0.99 | [111] | 9.0 | 367 |
| 43.34 | 6.75 | 49.91 | 1.00 | [111] | 7.0 | 460 |
| 42.81 | 7.16 | 50.03 | 1.00 | [111] | 7.0 | 469 |

FIG.12

PROCESS FOR CONTROLLED ORIENTATION OF FERROELECTRIC LAYERS

CROSS-REFERENCE TO RELATED APPLICATION

This is a division of U.S. application Ser. No. 08/758,600 filed Nov. 27, 1996 in the names of Jeffrey Roeder and Peter C. Van Buskirk for "Controlled Orientation of Ferroelectric Layers" now U.S. Pat. No. 5,719,417.

This application is concurrently filed on Nov. 27, 1996 with U.S. patent application Ser. No. 08/758,599 in the names of Jeffrey Roeder and Peter C. Van Buskirk for "Multiple Vaporizer Reagent Supply System for Chemical Vapor Deposition Utilizing Dissimilar Precursor Compositions."

BACKGROUND OF THE INVENTION

1. Field of the Invention

This invention relates to an integrated circuit structure and method of making that structure, and more particularly to a thin layer structure having ferroelectric properties.

2. Description of the Related Art

Ferroelectric materials are presently finding increased application in devices including non-volatile ferroelectric random access memories (NV-FcRAMs), uncooled infrared (IR) detectors, spatial light modulators, and microelectromechanical systems. Many of these applications require optimized ferroelectric properties. Due to the anisotropic nature of ferroelectric materials, such as $Pb(Zr,Ti)O_3$ (PZT), orientation control may be used to produce thin films or layers with optimized electrical properties. Ferroelectric PZT exists in two forms at ambient temperatures: a tetragonal phase, in which the polar vector is aligned parallel to the [001] direction (or c-axis) and a rhombohedral phase in which the polar axis is aligned along the [111] direction. In the tetragonal phase, anisotropy exists in a number of electric properties, including dielectric constant, remanent polarization, and pyroelectric coefficient. Several applications benefit by manipulation of these properties. Uncooled IR detectors require a high pyroelectric coefficient (p) and low dielectric constant ($\epsilon$) for maximum voltage responsivity, which is proportional to $p/\epsilon$.

In tetragonal materials, the maximum pyroelectric coefficient is found along the c-axis. Likewise, the minimum dielectric constant is also found along the c-axis of the crystal. It is thus highly advantageous to control orientation in a thin film or layer such that the c-axis is perpendicular to the plane of the film for a parallel plate capacitor geometry wherein the electrodes lie above and below the film and within parallel planes. In contrast, a film in which the a-axis is oriented perpendicular to the plane of the film for a parallel plate capacitor geometry results in low pyroelectric coefficient and high dielectric constant, which minimizes voltage responsivity. A [111] oriented tetragonal film represents an intermediate case because the average properties of the film can be expressed by resolving the anisotropy into the rectangular coordinates by simple vector algebra.

In rhombohedral ferroelectric PZT, maximum pyroelectric response can be attained in [111] oriented films. In another application, NV-FeRAMs require high remanent polarization to minimize performance requirements of sense amplifiers which read the stored charge. Furthermore, low switching voltages (i.e., low coercive fields) are useful to minimize power requirements for portable devices. In the PZT system, coercive field decreases with increasing Zr content, making high Zr compositions desirable. In this case, a [111] oriented rhombohedral PZT film maximizes the remanent polarization, and a [111] oriented tetragonal PZT film has a higher polarization than a [100] oriented tetragonal PZT film. This also occurs because the average properties of the film or layer can be expressed by resolving the anisotropy into the rectangular coordinates by simple vector algebra.

Various methods have been proposed for controlling the orientation of the crystal lattice structure of ferroelectric thin films. One method to control orientation is by utilizing substrate materials with a coefficient of thermal expansion (CTE) mismatched to that of the ferroelectric film. If the CTE of the substrate is higher than that of the film, the film will be in a state of compression on cooling through the Curie point, (i.e., the temperature where the crystalline phase transforms from the high temperature cubic (paraelectric) state to the low temperature tetragonal (ferroelectric) state. This situation results in a tetragonal film with a preferred [001] orientation. A substrate leading to this orientation must have a CTE larger than the CTE of PZT. MgO is such a substrate material.

A problem with this mismatched CTEs method of producing oriented tetragonal films is that silicon (Si) is the semiconducting substrate of choice for monolithic integration of ferroelectric material with integrated circuits. Silicon has a CTE that is less than that of PZT, so a PZT film deposited on a silicon substrate goes into tension on cooling through the Curie point, resulting in a highly undesirable [100] orientation.

Corresponding CTE issues are present for other substrate materials such as III-V materials, e.g., gallium arsenide and indium phosphide, or germanium. While crystal orientation may be controlled by using a substrate with a coefficient of thermal expansion (CTE) lower than the ferroelectric film, the present invention to control crystal orientation in ferroelectric thin films may in general have advantages for any substrate, since the bottom electrode is typically isolated from the semiconducting substrate by insulating layers that may have adhesion promoting or diffusion barrier properties. Substrates of the greatest technological interest are Si, GaAs, Ge, InP and any other semiconductor materials that would allow monolithic integration of the ferroelectric capacitor with transistors fabricated in the same substrate. Also of technological interest are substrates such as glass or ceramics, or metals, where the transistors reside in another substrate, and are connected to the ferroelectric capacitors in a hybrid configuration.

Another method for manipulating thin film orientation includes using seed layers. For example, in perovskite materials of formula $ABO_3$, the orientation is very sensitive to changes in A-site/B-site ratio. Changing the Pb/Ti ratio in a thin film of $PbTiO_3$ shifts the lattice orientation from [100] for Pb-rich films to [111] for Ti-rich films. See M. Shimizu, M. Sugiyama, H. Fujisawa, T. Hamano, T. Shiosaki, and K. Matsushige, "Effects of the Utilization of a Buffer Layer on the Growth of $Pb(Zr,Ti)O_3$ Thin Films by Metalorganic Chemical Vapor Deposition, J. Crystal Growth, Vol. 145 (1994), pp. 226–231. The [111] oriented seed layer resulting from a low A/B site ratio is useful for depositing thereon a high Zr content ferroelectric film because the polar axis in the high Zr content ferroelectric film is also along the [111] axis.

Although $PbTiO_3$ crystal orientation is influenced by the A-site/B-site ratio, PZT is not similarly influenced. There is a drawback from using the PbTiO$_3$ seed layer even though it can control orientation of the ferroelectric PZT film. Unfortunately, the Ti-rich films, which result in the desired [111] lattice orientation, also have a potential to generate oxygen vacancies, as charge compensation for excess Ti. These oxygen vacancies cause undesirable electrical conduction in the perovskite film. Oxygen vacancies may also interact with domain walls to cause fatigue and imprint.

Thus there remains a problem of uncovering a process that will produce a perovskite film without the shortcomings of the prior art.

SUMMARY OF THE INVENTION

These and other problems are resolved by a process for controlling orientation of the crystalline lattice structure of a layer of ferroelectric material deposited over a substrate. In the process, an adhesion layer is deposited on the substrate. A conductive layer is deposited over the adhesion layer. A layer of lead lanthanum titanate, (Pb,La)TiO$_3$ (PLT) is then deposited with a controlled crystal lattice orientation.

Thereafter, a ferroelectric layer of PZT with a predetermined crystal lattice orientation can be deposited over the seed layer. Alternatively, the seed layer can be deposited to a sufficient thickness to utilize its own ferroelectric properties.

The substrate in the foregoing process may be any suitable material, for example silicon, gallium arsenide, indium phosphide, or germanium.

In an exemplary process, the seed layer crystal lattice orientation of the PLT, or seed layer, is controlled by a ratio of lead (Pb) plus lanthanum (La) to titanium (Ti) in an A-site to B-site ratio.

The seed layer is formed of a combination of materials including lead (Pb), lanthanum (La), titanium (Ti) and oxygen (O). Lead and lanthanum occupy A-sites of the crystal lattice structure. In the seed layer, orientation of the crystal lattice structure is determined by the ratio of lead plus lanthanum to titanium. Orientation of the crystal lattice structure of the ferroelectric PZT layer is determined by the orientation of the crystal lattice structure of the seed layer. The ferroelectric PZT layer is lead zirconium titanite having a tetragonal or rhombohedral crystalline lattice structure.

In another aspect, all of the components of the seed layer, including lead, lanthanum, titanium and oxygen, are deposited simultaneously by chemical vapor deposition (CVD) using dissimilar precursors. The vaporization of the precursors for transport into the CVD reactor may be accomplished with a single vaporizer or by the use of multiple vaporizers.

Another aspect is an integrated circuit structure having an adhesion layer deposited on a substrate. A conductive layer is deposited over the adhesion layer. A seed layer is deposited over the conductive layer with a controlled crystal lattice orientation.

In a preferred embodiment, a ferroelectric layer is deposited over the seed layer causing a predetermined crystal lattice orientation.

In another embodiment, the seed layer is grown to a thickness sufficient to use its intrinsic ferroelectric properties. The seed layer is a combination of materials including lead, lanthanum, titanium, and oxygen. Lead and lanthanum occupy A-sites of the crystal lattice structure. Titanium occupies B-sites. Orientation of the crystal lattice structure is determined by the ratio of lead and lanthanum to titanium in an A-site/B-site ratio.

BRIEF DESCRIPTION OF THE DRAWINGS

A better understanding of the invention may be derived by reading the following detailed description of examples of the invention with reference to the drawings, wherein:

FIG. 12 is a table of illustrative values of parameters for different layers of PLT with various compositions.

DETAILED DESCRIPTION OF THE INVENTION, AND PREFERRED EMBODIMENTS THEREOF

Figure 1:
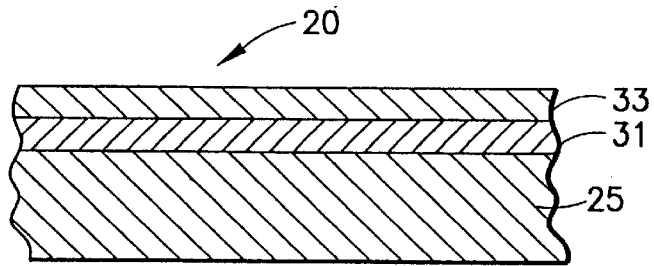
FIG. 1 shows a cross-sectional view of a silicon substrate with an adhesion layer.

Referring now to FIG. 1, there is shown a cross-section of a part of an integrated circuit device 20 that includes a substrate 25 and an adhesion layer. The substrate 25 may be a silicon (Si) substrate. Other substrate materials may also be used as for example GaAs, InP, or Ge. For illustrative purposes the adhesion layer is shown as two separate layers. A first layer 31, deposited on top of the substrate 25, is a layer of silicon dioxide (SiO$_2$), which may be native SiO$_2$ or a deposited layer of SiO$_2$, whose thickness may be suitably varied in accordance within the skill of the art. Another layer 33, deposited over the silicon dioxide, is an adhesion layer of zirconium oxide (ZrO$_2$), which may be approximately 500 Å thick. The adhesion layer 33 is deposited on the substrate for providing material that adheres well to both the silicon substrate 25 and a layer to be deposited on top of the adhesion layer. Other non-conductive or conductive materials may be used for the adhesion layer 33, for example, Ti, TiO$_2$, Zr, Hf, HfO$_2$, Ta, Ta$_2$O$_5$, TiN, TaN, etc. The layers 31 and 33 may be deposited by well known chemical vapor deposition or physical vapor deposition techniques.

Figure 2:
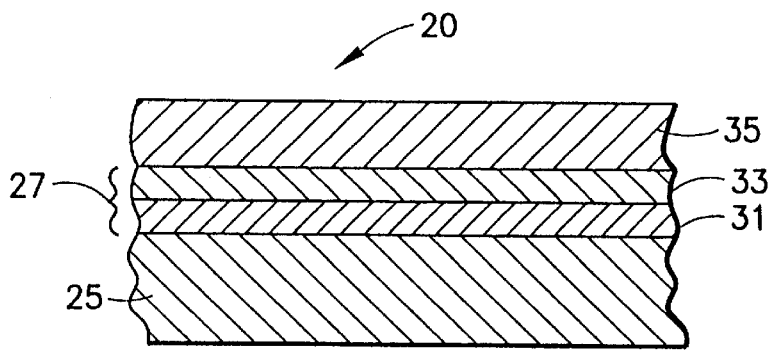
FIG. 2 shows the cross-sectional view of FIG. 1 following deposition of a layer of conductive material.

Referring now to FIG. 2, there is shown the cross-section of the partial device 20 of FIG. 1 upon which a conductive layer 35 is deposited over the top of the layer of zirconium oxide 33 included in the adhesion layer 27. The conductive layer 35 may be selected from a group of noble metals including, for example, platinum (Pt), rhodium (Rh), and palladium (Pd). Non-noble metals and other suitable conductors, such as conductive oxides, may also be used for the conductive layer 35. This conductive layer 35 may be deposited to a thickness of approximately 500–3,000 Å by conventional chemical vapor deposition or physical vapor deposition techniques.

Figure 3:
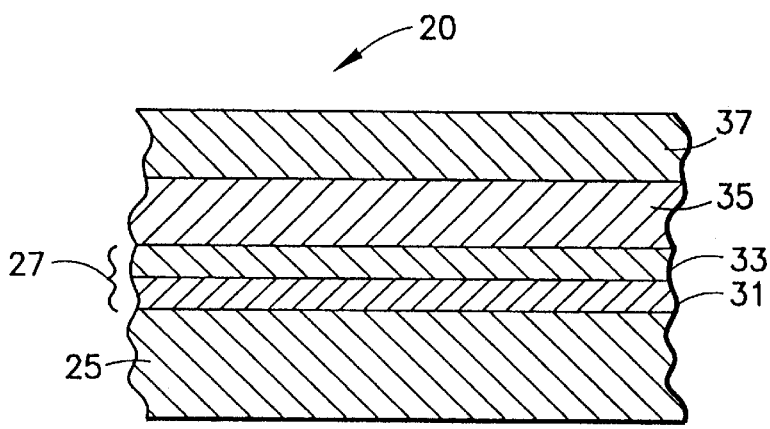
FIG. 3 is a cross-sectional view of the structure of FIG. 2 after a layer of seed or PLT material is deposited over the layer of conductive material.

Referring now to FIG. 3, there is shown the cross-section of the device 20 of FIG. 2 following deposition of a seed layer 37 that includes lead (Pb), lanthanum (La), titanium (Ti) and oxygen (O) in a material (Pb, La)TiO$_3$ generally referred to as PLT. The seed layer 37 is deposited by a metalorganic chemical vapor deposition (MOCVD) process to a thickness ranging approximately from 100 to 1,500 Å. The A-site/B-site ratio of the PLT material is controlled precisely during deposition to determine a preferred orientation of the crystalline lattice structure of the seed layer 37.

For the PLT material of the seed layer 37, the lead and the lanthanum are believed to occupy A-sites in the crystal lattice structure. Lanthanum functions as a donor dopant [La$_{Pb}^o$] in the lattice because it has a +3 charge and replaces lead which has a +2 charge.

Generally, donor doping of a layer containing Pb lowers electrical conductivity in the layer because the donor doping balances Pb deficiency in that layer. The Pb deficiency leads to Pb vacancies [V$_{Pb}$''], In the absence of acceptor dopants residing in the B-sites [A$_B$'], the Pb vacancies generally are compensated by oxygen vacancies [V$_O^{\infty}$]. Ionic conduction thus results in such a layer.

The following defect chemistry equation explains the effect.

$$[La_{Pb}^o]+2[V_O^{\infty}]=2\ [V_{Pb}'']+[A_B']$$

To control crystalline lattice structure orientation to a preferred [111] orientation, it is desired to lower the lead (Pb) content of the layer. By using lanthanum doping, the lead (Pb) content can be reduced below the stoichiometric value, and charge balance can be maintained without generating oxygen vacancies. Thus the crystalline lattice orientation can be controlled. The results will be discussed subsequently with reference to FIGS. 8–11.

In general the different layers of the seed layer structure can be deposited in different chambers or in one chamber. In the case where different chambers are used, physical vapor deposition (PVD), such as sputtering or evaporation, may be used for one of the layers, in conjunction with CVD. Alternatively PVD may be used for all of the layers. Different chambers may be physically separated or may be connected with a vacuum load-lock and the substrates manipulated by a robot (this last configuration is known as a cluster tool).

A preferred embodiment is for all the layers to be deposited by CVD and in that case multiple chambers may be used, or the different layers may be deposited in a single CVD chamber using multiple vaporizers. For a PLT seed layer to control the orientation of a PZT film, one technique would be to vaporize Pb and Ti precursors in a vaporizer held at 200° C., to vaporize the La precursor in a vaporizer held at 220° C., and to vaporize the Zr precursor in a vaporizer held at 230° C. The PLT seed layer would be deposited using the first two vaporizers, and Pb/La ratio and the (Pb+La)/Ti ratio of the resulting thin film would be controlled so as to achieve [111] crystal orientation. The composition would be controlled by manipulating the liquid flow rates to the separate vaporizers and the solution concentrations, as well as the other deposition parameters such as P, gas flow rates, and substrate temperature. Electrical leakage currents in the PLT film would be lower because oxygen anion vacancies would be compensated by the L,a donor dopant as described above.

After deposition of the seed layer, the gaseous La precursor flow would be diverted to the bypass and the gaseous Zr precursor would be switched to flow to the reactor, enabling deposition of PZT. Fine control of the timing of those switching operations would be needed to achieve the desired composition profile and the optimum electrical and physical properties. Control of the PZT composition would be performed in a manner similar to PLT. Once the PZT film was of sufficient thickness, the gaseous Pb-Ti and Zr precursors would be diverted from the reactor and deposition would be complete. In another embodiment the gaseous La precursor would continue to flow to the reactor, resulting in deposition of PLZT, and the composition of that layer would be controlled as described above for PLT.

Figure 4:
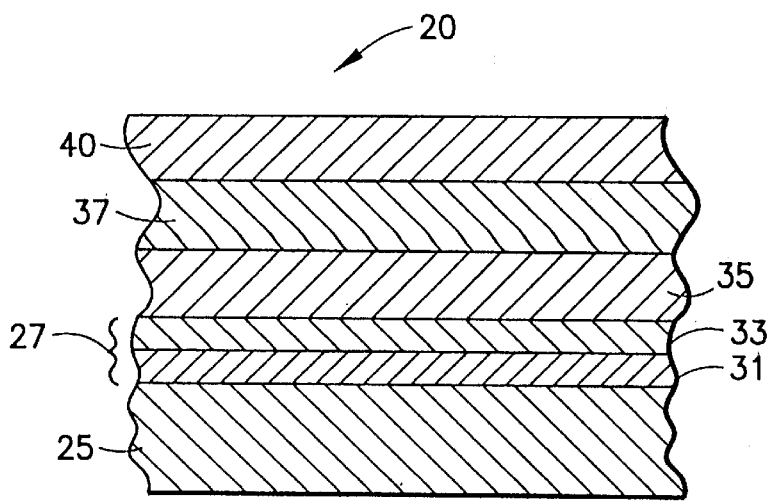
FIG. 4 shows a cross-section of the structure of FIG. 3 following deposition of a layer of ferroelectric PZT material on the seed layer.

Referring now to FIG. 4, there is shown a cross section of the device 20 of FIG. 3 following deposition of another ferroelectric layer 40 onto the seed layer 37 that includes lead (Pb), zirconium (Zr), titanium (Ti) and oxygen (O) in a material Pb(Zr, Ti)O$_3$, generally referred to as PZT. The ferroelectric layer 40 is deposited by a metalorganic chemical vapor deposition (MOCVD) process to a thickness ranging approximately from 100 Å to 100 μm depending on the intended device application. The ratio of the B-site cations, Zr/Ti, is controlled precisely during deposition to determine the crystalline lattice structure of the ferroelectric layer 40 as either tetragonal for Zr/Ti<52/48 or rhombohedral for Zr/Ti>52/48. It is generally accepted that compositions at Zr/Ti=52/48 are a mixture of tetragonal and rhombohedral crystalline phases.

Figure 5:
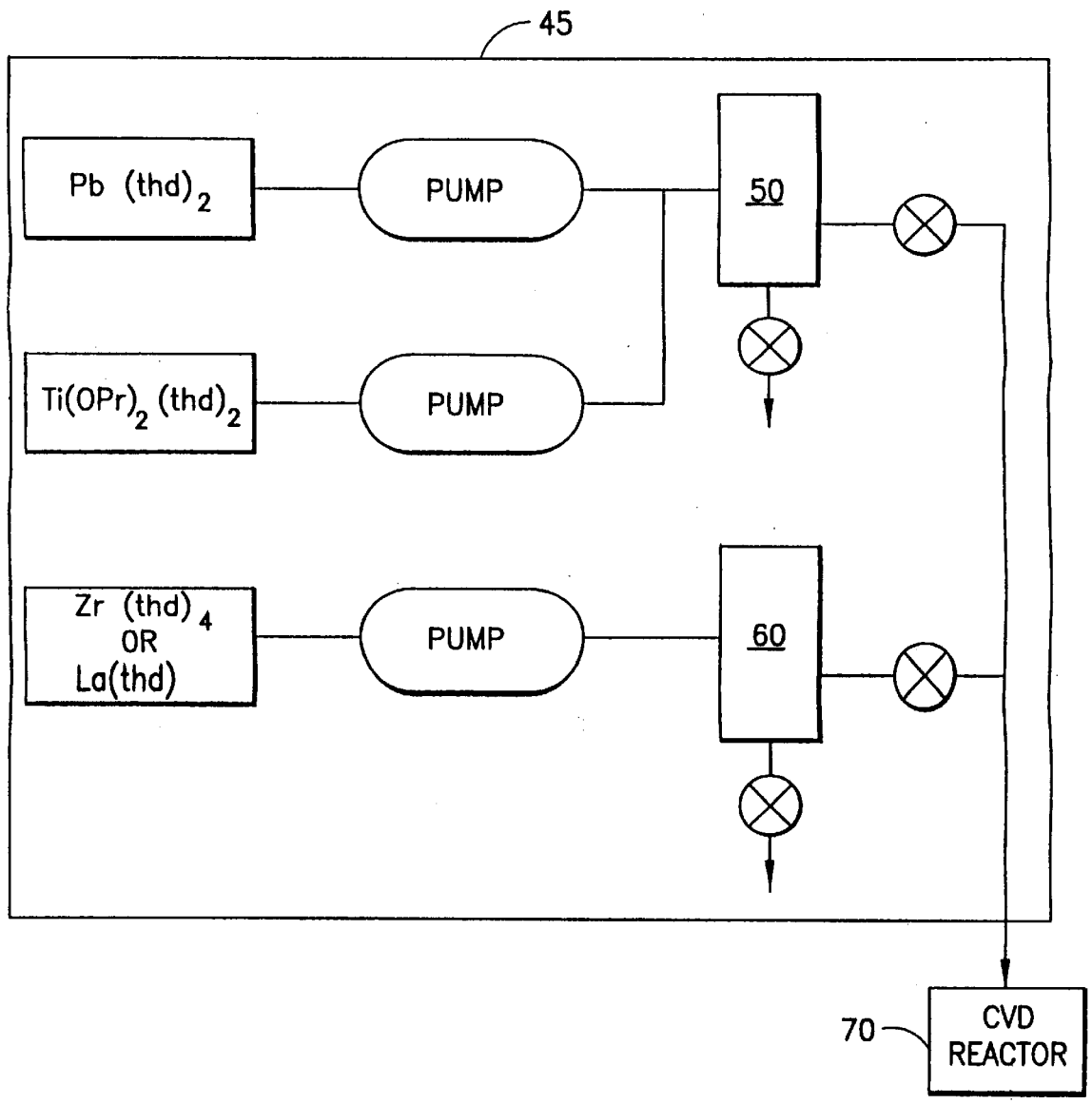
FIG. 5 is a schematic drawing of a multiple vaporizer apparatus arranged for simultaneous metalorganic chemical vapor deposition of dissimilar vaporization characteristics precursor materials.

Referring now to FIG. 5, there is shown a schematic diagram of a multiple vaporizer apparatus 45 for accomplishing chemical vapor deposition (CVD) of multiple precursor materials that have dissimilar vaporization characteristics. See for example, U.S. patent application Ser. No. 08/758,600, filed Nov. 27, 1996 in the names of Jeffrey Roeder and Peter Van Buskirk and entitled "Multiple Vaporizer Reagent Supply System for Chemical Vapor Deposition Utilizing Dissimilar Precursor Compositions." Even though some of the precursor materials require vaporization temperature or pressure conditions differing from others to be used in a single layer of material, the apparatus of FIG. 5 can vaporize all of the precursor materials simultaneously for deposition.

In a first vaporizer 50, two or more precursors, such as bis-tetramethylheptanedionatolead, Pb(thd)$_2$, which is used for depositing lead (Pb) and titanium (Ti) concurrently, are transmitted simultaneously to the first vaporizer. The precursors are transmitted in respective volumes to achieve the desired stoichiometry. These precursors have vaporization characteristics which are sufficiently similar, particularly in their respective temperatures of vaporization, that they are vaporized together in one vaporizer held at a selected temperature.

At the same time, another precursor with significantly different vaporization characteristics, than the above-mentioned precursors, is transmitted to a second vaporizer 60. Quantity of the material to be deposited from this precursor is proportioned with the quantities of the materials to be deposited from the first vaporizer 50 to also achieve the desired stoiciometry in the layer of material to be deposited. The second vaporizer 60 is held at a second selected temperature which is appropriate for vaporizing its precursor. When PLT is to be deposited, a lanthanum precursor is substituted for the zirconium precursor shown in FIG. 5.

A carrier fluid or fluids may be required to transmit the precursors to the vaporizers 50 and 60 and a deposition chamber where the layer of multi-component material is to be deposited all at once on a substrate or on a substrate with one or more layers of material previously deposited thereon. CVD reactor 70 is shown as an illustrative deposition chamber.

Advantageously, the multiple vaporizer apparatus 45 of FIG. 5 can be used also to deposit two layers of different materials without recharging the supplies of precursor materials. For example, the supply lines to the first vaporizer 50 may open for flow of two compatible precursors for deposition of a first layer. When that first layer is fully deposited and before the substrate is moved, supply lines to the second vaporizer 60 may open for flow of one or more precursors that are non-compatible in vaporization with the precursors for the first vaporizer 50. All of the vaporized precursors now flow together into the deposition chamber. Thus a second layer of material having a different composition than the first layer is deposited on the first layer. Illustratively, the first layer is selected to be a layer of PLT material. PLT films were deposited by MOCVD using metalorganic precursors dissolved in an organic solvent which were flash vaporized. For PLT, $Pb(thd)_2$, $La(thd)_3$, and $Ti(OiPr)_2(thd)_2$ were used as metalorganic precursors. The process was carried out in an oxidizing ambient at reduced pressure at temperatures between 525–550° C. The process could also be carried out with other metalorganic precursors or alternatively by physical vapor deposition methods, e.g, sputtering or pulsed laser depositon.

The PLT material forms a layer of tetragonal crystalline lattice structure with a [111] orientation. For a seed layer, the PLT is deposited to a thickness in a range between 50 Å and 500 Å. The crystalline lattice orientation of the seed layer of PLT affects both the dielectric constant and the pyroelectric coefficient of the resulting layer.

The second layer is selected to be a layer of PZT material. For PLT, $Pb(thd)_2$, $La(thd)_3$, and $Ti(OiPr)_2(thd)_2$ were used as metalorganic precursors. For PZT, $Zr(thd)_4$ was used with $Pb(thd)_2$ and $Ti(OiPr)_2(thd)_2$. The process was carried out in an oxidizing ambient at reduced pressure at temperatures between 525–550° C. The process could also be carried out with other metalorganic precursors or alternatively by physical vapor deposition methods, e.g, sputtering or pulsed laser depositon.

For both PLT and PZT, a carrier gas such as argon may optionally be employed.

The first (PLT sources) vaporizer was held at 200° C. The second (PZT sources) vaporizer was held at a temperature of 230° C. The precursors were transmitted to the vaporizers at flow rates controlled to achieve the desired stoichiometry in the grown film. Such flow rates are very system-dependent. Ferroelectric PZT layers may be deposited by this method to a thickness commensurate with the device requirements.

Because the seed layer of PLT material is controlled to a tetragonal crystalline lattice structure with [111] orientation, the layer of PZT material preferentially forms either a tetragonal or a rhombohedral crystalline lattice structure with a [111] orientation, depending on the Zr to Ti ratio of the PZT film.

Figure 6:
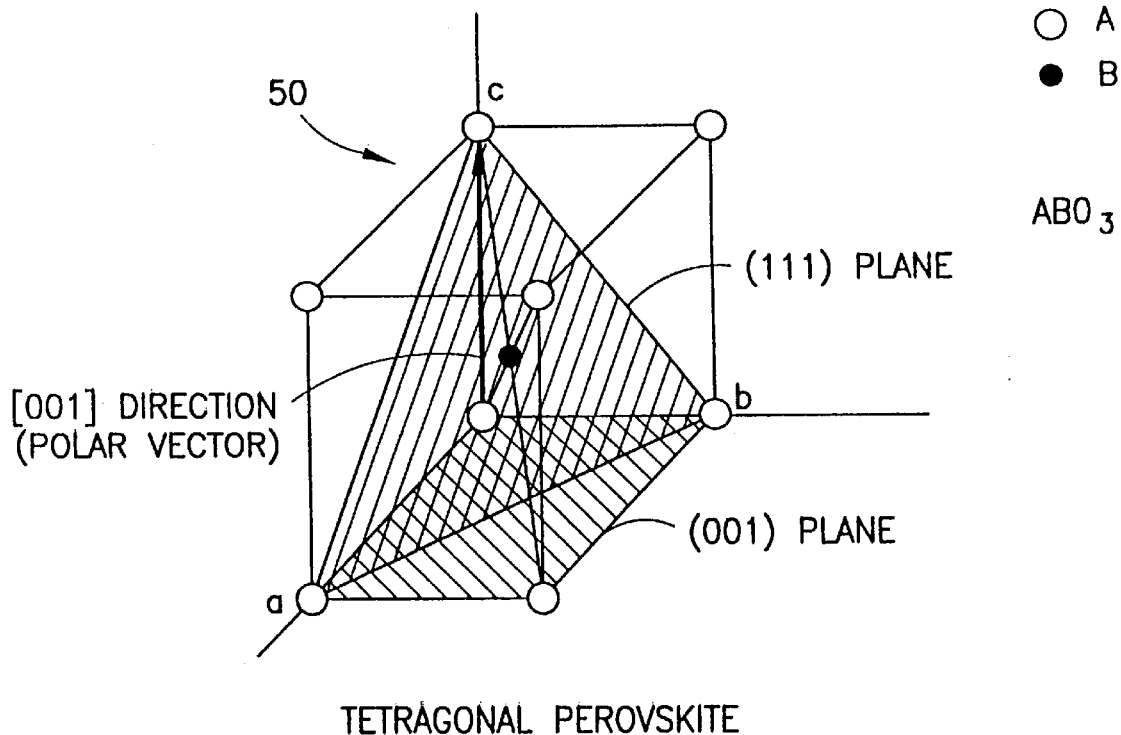
FIG. 6 is a perspective view of a tetragonal crystal lattice orientation of a ferroelectric material.

Referring now to FIG. 6, there is shown a perspective view of a portion of a tetragonal crystalline lattice structure 50. There are six planar faces. Each face is a rectangle. Orientation of the lattice is defined by axes which align, respectively, with edges a, b, and c. In this lattice structure, $a=b\neq c$. For a layer of PLT, the tetragonal crystal lattice provides the maximum ferroelectric effect when the polar vector (oriented parallel with the c-axis) is oriented perpendicular to parallel plate electrodes. A-sites are shown as open circles. The B-site is shown as a solid circle.

Figure 7:
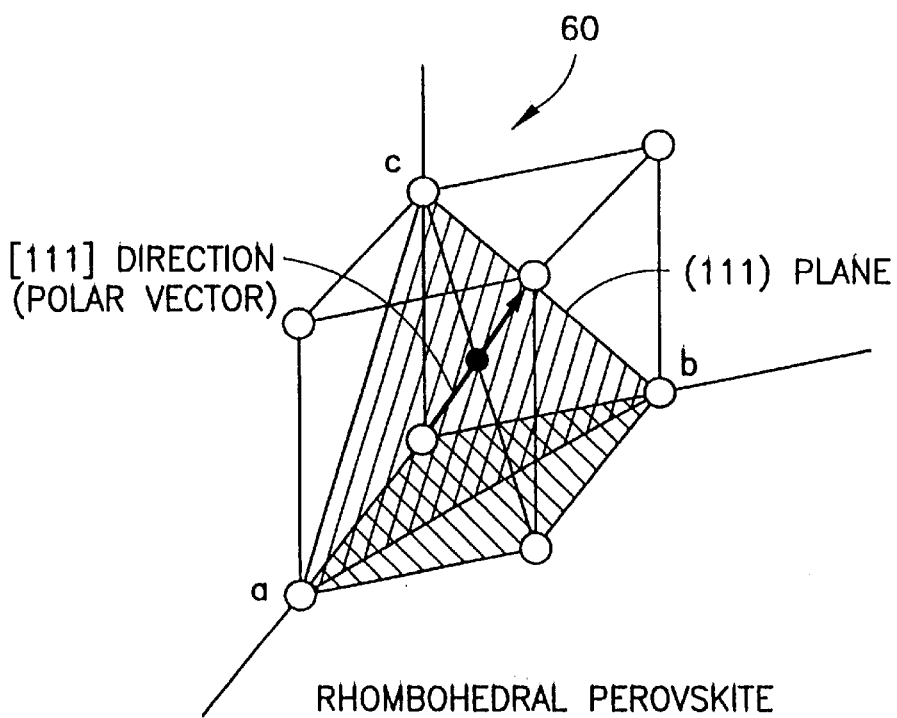
FIG. 7 is a perspective view of a rhombohedral crystal lattice orientation of a ferroelectric material.

Referring to FIG. 7, there is a perspective view of a portion of a rhombohedral crystalline lattice structure 60. Again there are six planar faces. Each face is a parallelogram. The axes are not at right angles with one another. For a layer of PZT, the rhombohedral crystalline thin film with a [111] orientation provides maximum ferroelectric effect.

Bipoles in such a lattice structure of PZT are oriented in the direction of the heavy arrow. A-sites and B-sites are shown in a similar convention, as in FIG. 6.

FIGS. 8 through 11 depict x-ray diffraction (XRD) patterns for two different compositions of lead (Pb), lanthanum (La), and titanium (Ti) layers and two different compositions of lead (Pb), zirconium (Zr), and titanium (Ti) layers, all of which were deposited on $Pt/ZrO_2/SiO_2/Si$ substrates by MOCVD at approximately 525° C.–550° C. In each case, the substrate is silicon, the adhesion layer is 500 Å of $SiO_2$ and 500 Å of $ZrO_2$. The metal layer is 1000 Å of Pt.

By varying the A-site/B-site ratio of lead and lanthanum during deposition of the different composition PLT layers on top of the layer of platinum, different crystalline lattice structure orientations were achieved.

Figure 8:
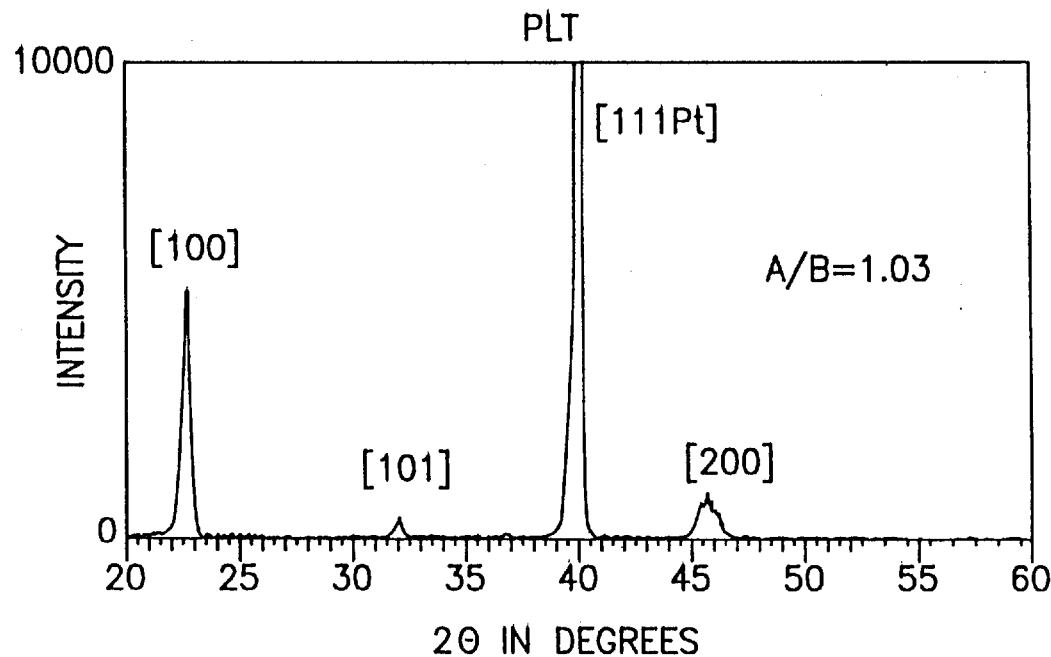
FIG. 8 is an x-ray diffraction (XRD) pattern for a PLT film having an A-site/B-site ratio of 1.03.

For example, FIG. 8 shows the resulting crystalline lattice orientation for a PLT layer having an A-site/B-site ratio equal to 1.03. The diffraction peak that is labeled [100] has a much greater magnitude than the peaks labeled [101] and [111]. Thus it is concluded that the crystalline lattice orientation for an A-site/B-site ratio, greater than 1.0, is predominantly [100] orientation.

Figure 9:
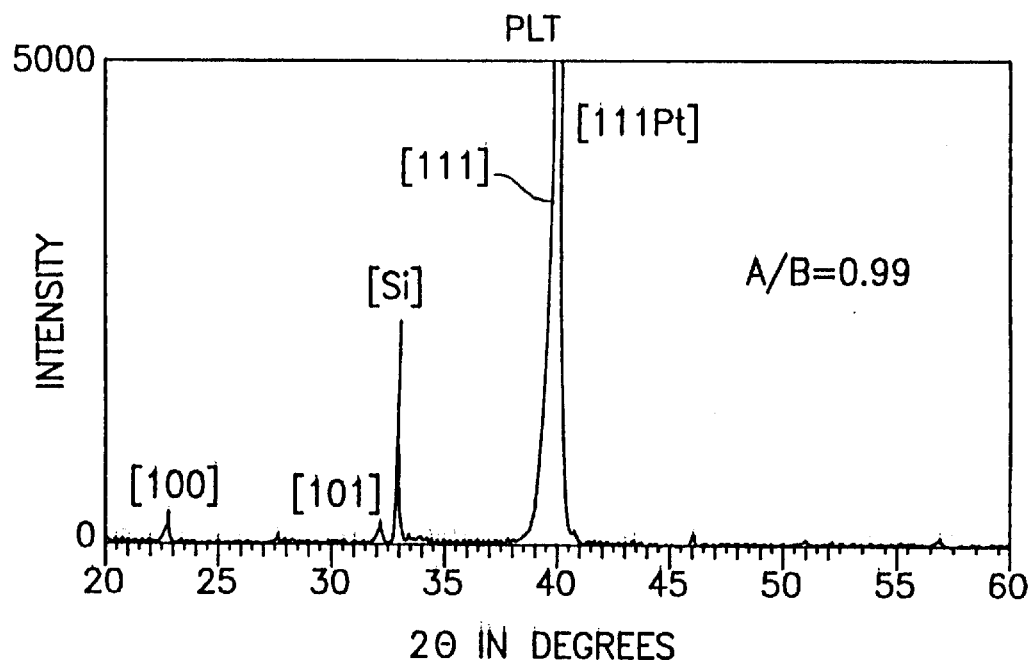
FIG. 9 is an x-ray diffraction (XRD) pattern for a PLT film having an A-site/B-site ratio of 0.99.

Referring now to FIG. 9, the resulting crystalline lattice orientation for a PLT layer having an A-site/B-site ratio equal to 0.99 is nearly 100% [111] orientation. The diffraction peak labeled [111] by a pointer has a much greater magnitude than the diffraction peaks labeled [100] and [101] indicating that almost all of the crystal lattice is in the [111] orientation.

Similarly to the graph of FIG. 8, FIG. 9 shows the orientation for a crystal lattice except that it is a layer of PZT. There are shown high diffraction peaks for orientations [100] and [110/101] and low peak intensities for the orientations [111], [002], and [200]. The A-site/B-site ratio is equal to 1.0.

Figure 11:
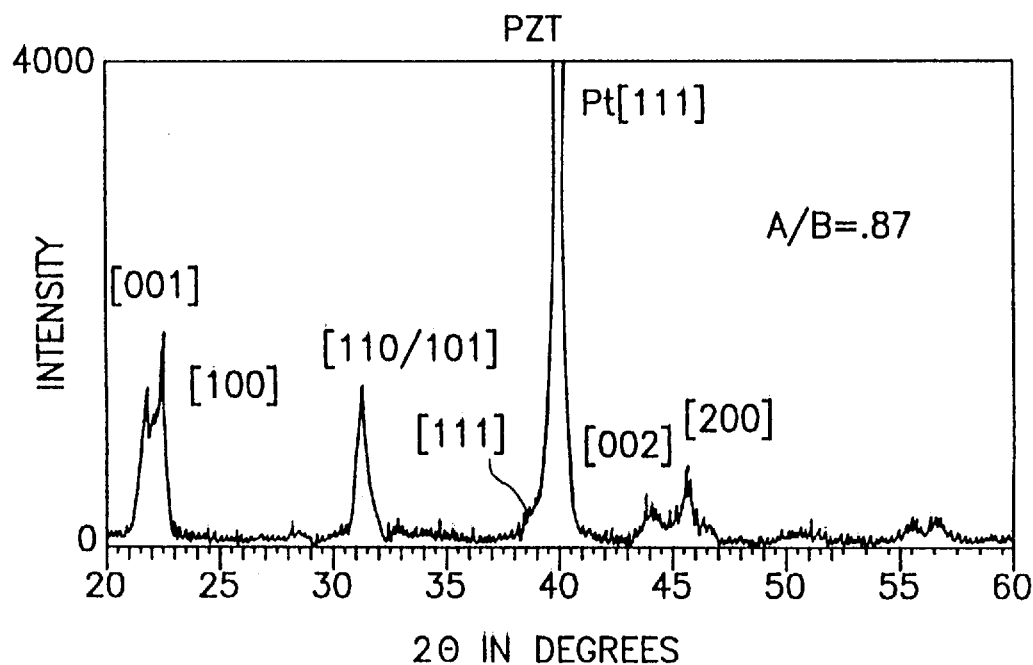
FIG. 11 is an x-ray diffraction (XRD) pattern for a PZT film having an A-site/B-site ratio of 0.87.

Referring now to FIG. 11, the A-site/B-site ratio is equal to 0.87 for the examined layer of PZT. All of the diffraction peaks are near the same magnitude.

Figure 10:
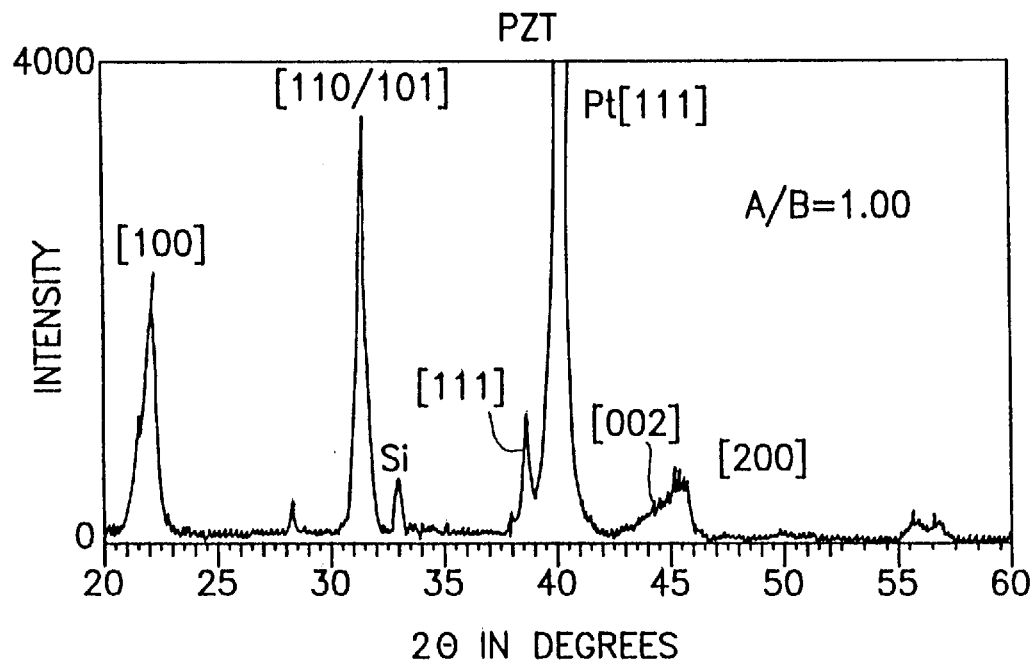
FIG. 10 is an x-ray diffraction (XRD) pattern for a PZT film having an A/B site ratio of 1.00.

Thus it is demonstrated in FIGS. 9 and 10 that crystal lattice orientation of PZT is not influenced by the A-site/B-site ratio.

As shown in FIG. 12, there is a table presenting changes in the crystal lattice orientation, the pyroelectric coefficient p, and the dielectric constant $\epsilon$ for various A-site/B-site ratios for exemplary PLT layers. This table of values is consistent with the anisotropy of a layer of tetragonal PLT.

It has been noted that the crystalline lattice orientation for a layer of PZT material does not appear to change with variation of its A-site/B-site ratio. Thus the fact that the crystal lattice orientation does change in a layer of PLT material with variation of the A-site/B-site ratio is a wholly unexpected relationship.

As described hereinbefore, the unexpected relationship between the A-site/B-site ratio and crystal lattice orientation for PLT is related to a seed layer in a ferroelectric device. It is clear that the relationship also is useful to control the orientation of a PLT layer, as a ferroelectric layer on its own and for other purposes.

The foregoing describes one or more exemplary embodiments of the invention and a method for fabricating devices utilizing the principal of the invention. These embodiments and method, together with other embodiments and methods made obvious in view thereof, are considered to fall within the scope of the appended claims.

What is claimed is:

1. The method of forming a ferroelectric layer with a predetermined crystal orientation, the method comprising the steps of:

a) depositing an adhesion layer on a substrate;

b) depositing a conductive layer over the adhesion layer; and c) depositing a layer of PLT with controlled crystal lattice orientation.

2. The method of claim 1 wherein:

the layer of PLT crystal lattice orientation is controlled by controlling an A-site/B-site ratio.

3. The method of claim 1 wherein:

the substrate is formed of a material selected from the group consisting of silicon, gallium arsenide, indium phosphide, and germanium.

4. The method of claim 2 wherein:

the layer of PLT includes the elements lead (Pb), lanthanum (La), titanium (Ti), and oxygen (O), wherein Pb and La occupy A-sites and Ti occupies B-sites of the crystal lattice structure.

5. The method of claim 3 wherein:

orientation of the crystal lattice structure of the layer of PLT is determined by selecting a desired ratio of Pb and La to Ti and forms a tetragonal lattice structure.

6. The method of claim 1 wherein:

depositing the adhesion layer comprises:

forming a layer of silicon dioxide on the substrate; and depositing a layer of zirconium oxide over the layer of silicon dioxide.

7. The method of claim 1 wherein:

the conductive layer is fabricated in a material selected from a group of materials including noble metals, non-noble metals, and conductive oxides.

8. The method of claim 1 wherein:

the layer of PLT is deposited by metalorganic chemical vapor deposition.

9. The method of claim 1 further comprising the further step of:

depositing a ferroelectric layer of PZT with the predetermined crystal lattice orientation over the layer of PLT.

10. The method of claim 8 wherein:

the ferroelectric layer is fabricated in lead zirconium titanate $Pb(Zr,Ti)O_3$ having a tetragonal crystalline lattice structure.

11. The method of claim 8 wherein:

the ferroelectric layer is fabricated in lead zirconium titanate $Pb(Zr,Ti)O_3$ having a rhombohedral crystalline lattice structure.

12. The method of claim 1 wherein:

the substrate is formed of a material selected from the group consisting of silicon, gallium arsenide, indium phosphide, and germanium.

* * * * *

UNITED STATES PATENT AND TRADEMARK OFFICE
CERTIFICATE OF CORRECTION

PATENT NO : 5,998,236
DATED : Dec. 7, 1999
INVENTOR(S) : Jeffrey Roeder and Peter C. Van Buskirk It is certified that error appears in the above-identified patent and that said Letters Patent are hereby corrected as shown below:

| | |
|---|---|
| Column 1, Line 27: | change "(NV-FcRAMs)" to --(NV-FeRAMs)--. |
| Column 1, line 42: | change "(p)" to --(p)--. |
| Column 1, line 44: | change "p/∈" to --p/∈--. |
| Column 3, line 31: | "The seed layer" should not start a new paragraph. |
| Column 5, line 17: | change "[$V_{Pb}$"]," to --[$V_{Pb}$"].--. |
| Column 6, line 29: | change "08/758,600" to --08/758,599--. |
| Column 8, line 43: | change "p" to --p--. |

Signed and Sealed this

Twenty-second Day of May, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

| | | |
|---|---|---|
| PATENT NO. | : 5,998,236 | Page 1 of 1 |
| APPLICATION NO. | : 09/024246 | |
| DATED | : December 7, 1999 | |
| INVENTOR(S) | : Jeffrey Roeder et al. | |

It is certified that error appears in the above-identified patent and that said Letters Patent is hereby corrected as shown below:

Column 1, line 18: please add: -- GOVERNMENT RIGHTS IN INVENTION
Some aspects of this invention were made in the performance of U.S. Government Contract No. DAAL01-95-C-0035. The U.S. Government has certain rights in the invention hereof. --.

Signed and Sealed this

Thirtieth Day of November, 2010

David J. Kappos
*Director of the United States Patent and Trademark Office*